United States Patent
Darsow et al.

(10) Patent No.: US 7,143,379 B2
(45) Date of Patent: *Nov. 28, 2006

(54) APPARATUS AND METHOD FOR PERFORMING STATIC TIMING ANALYSIS OF AN INTEGRATED CIRCUIT DESIGN USING DUMMY EDGE MODELING

(75) Inventors: Craig Marshall Darsow, Rochester, MN (US); Todd Edward Obermiller, Plymouth, MN (US)

(73) Assignee: International Business Machines Corporation, Armonk, NY (US)

( * ) Notice: Subject to any disclaimer, the term of this patent is extended or adjusted under 35 U.S.C. 154(b) by 447 days.

This patent is subject to a terminal disclaimer.

(21) Appl. No.: 10/777,261

(22) Filed: Feb. 12, 2004

(65) Prior Publication Data
US 2005/0183050 A1    Aug. 18, 2005

(51) Int. Cl.
*G06F 9/45* (2006.01)
(52) U.S. Cl. .............................................. 716/6; 716/2
(58) Field of Classification Search ................ 716/1–2, 716/6, 18
See application file for complete search history.

(56) References Cited

U.S. PATENT DOCUMENTS 6,609,233 B1 *  8/2003  Foltin et al. .................... 716/6

2005/0066296 A1 *  3/2005  Visweswariah ................ 716/6

OTHER PUBLICATIONS

Patent Application entitled "Apparatus and Method for Performing Static Timing Analysis of an Integrated Circuit Design," Craig M. Darsow et al., filed Feb. 12, 2004.

* cited by examiner

*Primary Examiner*—Paul Dinh
(74) *Attorney, Agent, or Firm*—Martin & Associates, LLC

(57) ABSTRACT

An apparatus and method perform static timing analysis on an integrated circuit design. Certain pessimistic assumptions regarding slack when data launch and clock test signals are on opposite edges and derived from common logic blocks are improved by creating a dummy clock edge that is on the same edge as the data launch signal, and allowing the timing tool to compute the slack improvement using its native functions. The slack improvement is then multiplied by a conversion factor, and the result is used to adjust the slack. The apparatus and method give credit for slack in common blocks automatically, thereby allowing a large number of pessimistic slack values to be automatically corrected and reducing the workload of an integrated circuit designer in addressing the timing problems in an integrated circuit design.

14 Claims, 8 Drawing Sheets

APPARATUS AND METHOD FOR PERFORMING STATIC TIMING ANALYSIS OF AN INTEGRATED CIRCUIT DESIGN USING DUMMY EDGE MODELING

RELATED APPLICATION

This patent application is related to a U.S. patent application "APPARATUS AND METHOD FOR PERFORMING STATIC TIMING ANALYSIS OF AN INTEGRATED CIRCUIT DESIGN", Ser. No. 10/777,262 filed on Feb. 12, 2004 which is incorporated herein by reference.

BACKGROUND OF THE INVENTION

1. Technical Field

This invention generally relates to integrated circuits, and more specifically relates to static timing analysis of integrated circuit designs.

2. Background Art

The proliferation of modern electronics is due in large part to the development of the integrated circuit. Integrated circuits allow many different circuit elements to be implemented on a single chip. As technology advances, the number of circuit elements on a chip of a given size increases, enhancing the performance and reducing the cost of integrated circuits.

The design of integrated circuits is typically performed in three stages. The first stage is logic design, wherein the desired operation of the integrated circuit is defined. The second stage is logic synthesis, wherein the desired operation is translated into the required circuit elements for a given technology. The third stage is physical design, which assigns the placement of these elements and routing which creates the wire interconnect of these elements on the integrated circuit. Placement defines the location of the circuit elements on the integrated circuit. Routing defines interconnections between circuit elements.

At the logic synthesis stage, a static timing tool is typically used to perform a static timing analysis. Static timing analysis generally takes into account best-case and worst-case delays of various circuit elements, thereby generating a list of problems that need to be corrected. One common static timing tool developed by IBM is known as EinsTimer. EinsTimer is a sophisticated timing tool that performs static timing analysis on an integrated circuit design to identify potential timing problems with the design. EinsTimer includes sophisticated methods for performing the timing analysis. However, EinsTimer makes unduly pessimistic timing assumptions in some cases. As a result, integrated circuit designers must generally account for the pessimistic timing assumptions in a manual fashion. Without a mechanism for improving the pessimistic timing assumptions in known static timing tools, the integrated circuit design industry will have to spend excessive time manually analyzing circuits that are identified as a problem using a static timing tool.

DISCLOSURE OF INVENTION

An apparatus and method perform static timing analysis on an integrated circuit design. Certain pessimistic assumptions regarding slack when data launch and clock test signals are on opposite edges and derived from common logic blocks are improved by creating a dummy clock edge that is on the same edge as the data launch signal, and allowing the timing tool to compute the slack improvement using its native functions. The slack improvement is then multiplied by a conversion factor, and the result is used to adjust the slack. The apparatus and method give credit for slack in common blocks automatically, thereby allowing a large number of pessimistic slack values to be automatically corrected and reducing the workload of an integrated circuit designer in addressing the timing problems in an integrated circuit design.

The foregoing and other features and advantages of the invention will be apparent from the following more particular description of preferred embodiments of the invention, as illustrated in the accompanying drawings.

BRIEF DESCRIPTION OF DRAWINGS

The preferred embodiments of the present invention will hereinafter be described in conjunction with the appended drawings, where like designations denote like elements, and.

BEST MODE FOR CARRYING OUT THE INVENTION 1.0 Overview

The present invention relates to static timing analysis of an integrated circuit design. For those not familiar with this subject, this Overview section will provide background information that will help to understand the present invention.

IBM EinsTimer

IBM developed a static timing tool known as EinsTimer. EinsTimer is used to automatically analyze the timing of an integrated circuit design at each node in the design. One specific analysis that EinsTimer performs is known as Linear Combination of Delays (LCD) analysis. LCD analysis allows modeling different amounts of delay in a set of logic blocks to generate worst-case timing scenarios. EinsTimer includes a feature known as Common Path Pessimism Removal (CPPR) that allows the tool to analyze the path for a clock test signal and a data launch signal and determine when both the clock test signal and data launch signal pass through a common block, and to give credit for the penalty imposed in the common blocks. EinsTimer's CPPR only gives credit when the clock test and data launch signal have the same edge when passing through those common blocks. When the clock test and data launch signals have opposite edges, EinsTimer does not improve the pessimistic timing assumptions. As a result, EinsTimer may identify several timing problems that are not actually problems because it does not recognize the common path these signals pass through. An example will help illustrate.

Figure 2:
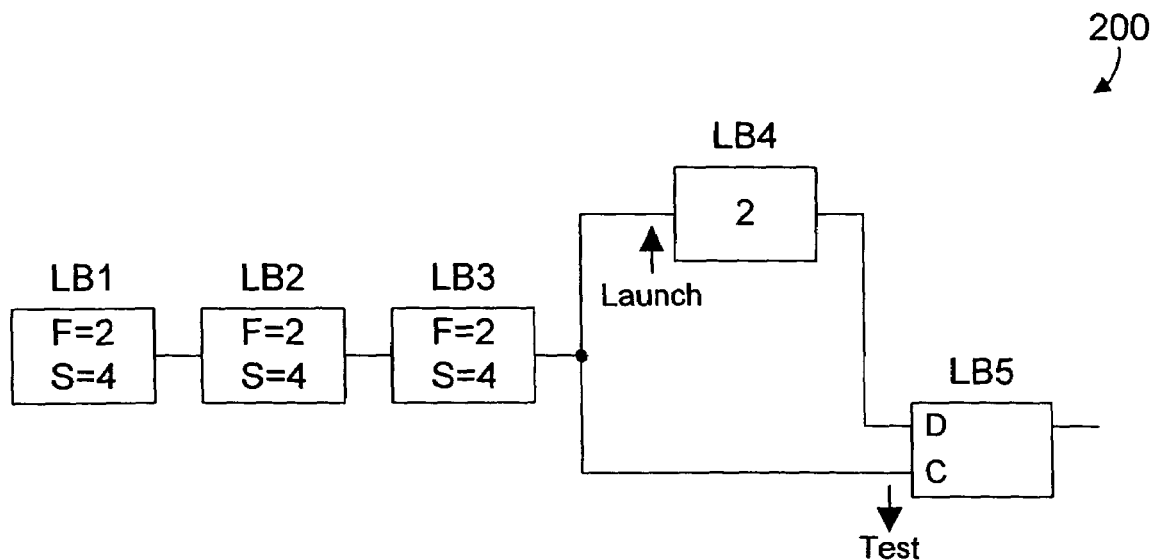
FIG. 2 is a block diagram of a first sample circuit in an integrated circuit design.
Figure 3:
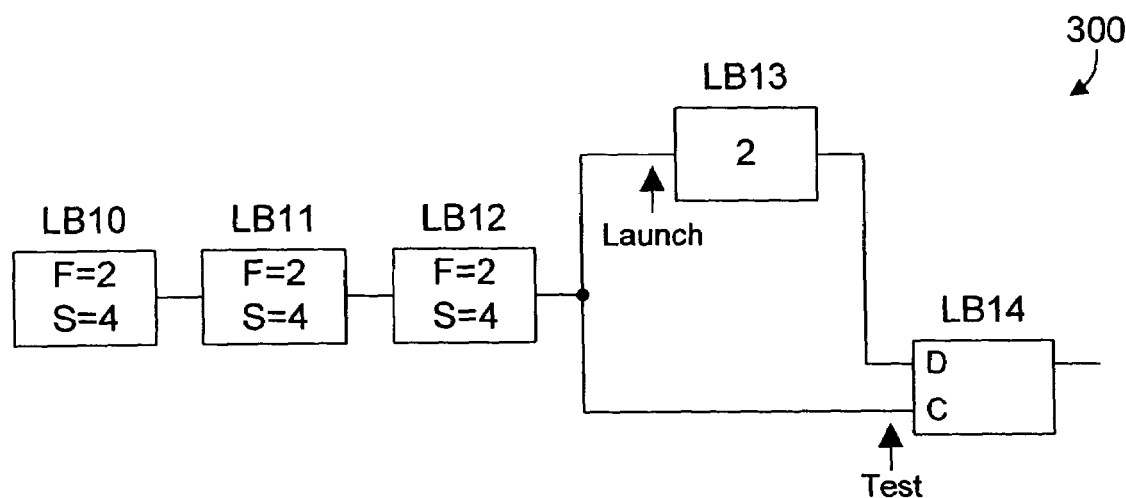
FIG. 3 is a block diagram of a second sample circuit in an integrated circuit design.

FIGS. 2 and 3 show sample circuits that could be implemented in an integrated circuit design. The circuits are made up of logic blocks. Thus, circuit 200 in FIG. 2 is made of logic blocks LB1–LB5. Circuit 300 in FIG. 3 is made up of logic blocks LB10–LB14. The arrows at the input of LB4 and LB5 in FIG. 2 indicate the direction of the signal that latches the data. Thus, LB4 latches the data on the rising edge of the input, as shown by the up arrow on its input. LB5, in contrast, latches the data on the falling edge of the input, as shown by the down arrow on its input.

Circuits 200 and 300 are identical except that LB5 latches data on the falling edge of the clock test signal while LB14 latches data on the rising edge of the clock test signal. This difference is significant, as shown below.

Static Timing Analysis Using EinsTimer

Figure 4:
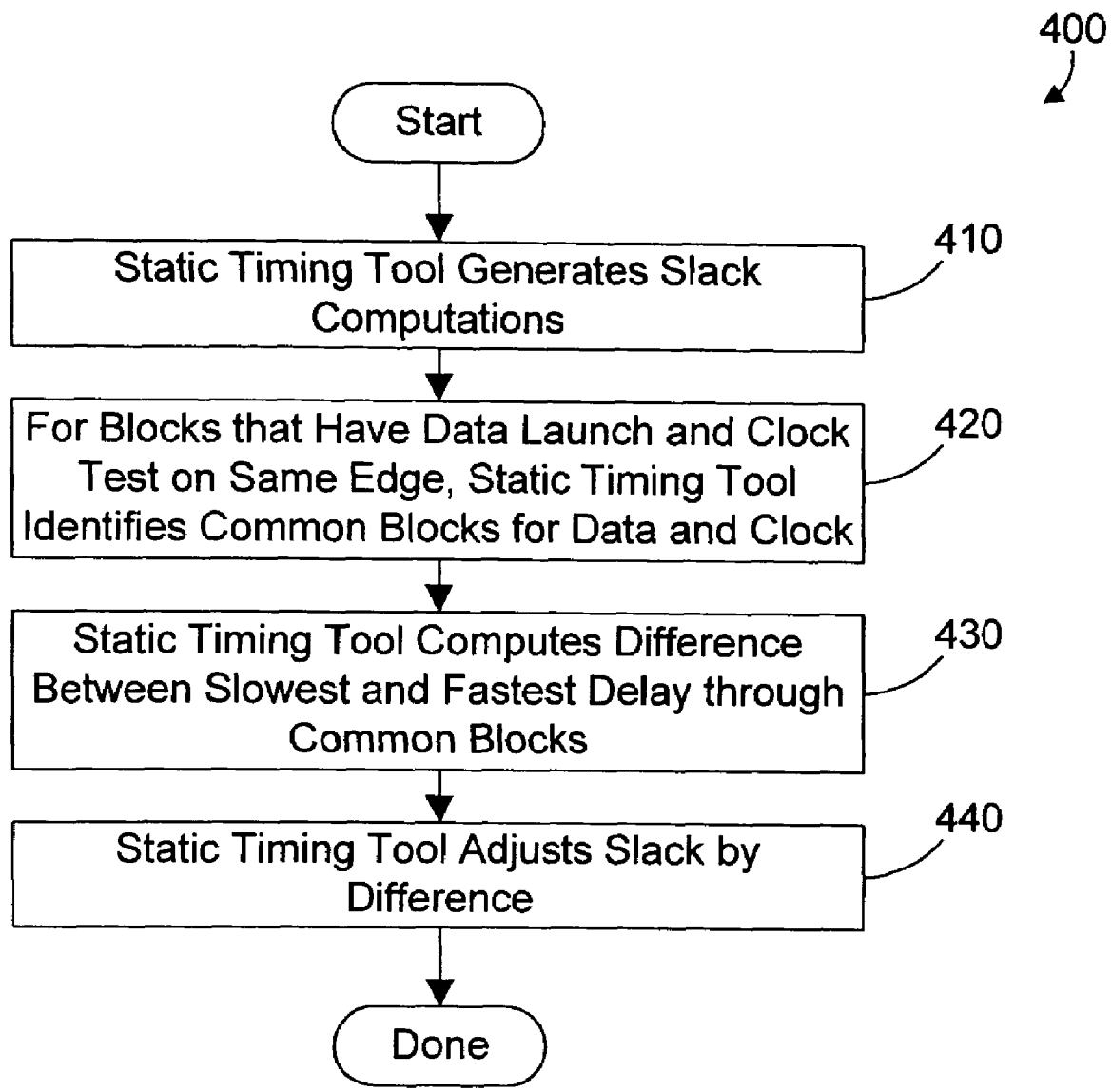
FIG. 4 is a flow diagram of a prior art method for adjusting slack in an integrated circuit design.

A prior art method 400 in FIG. 4 shows some of the steps a static timing tool, such as EinsTimer, performs during static timing analysis on an integrated circuit design. EinsTimer generates slack computations in the integrated circuit design (step 410). EinsTimer then determines which logic blocks in the integrated circuit design have data launch and clock test signals on the same edge, and identifies a set of common blocks through which both clock test and data launch signals pass (step 420). EinsTimer then computes the difference between the slowest and fastest delay through the common blocks (step 430). The slack is then adjusted by the difference computed in step 430 (step 440). Prior art method 400 improves the pessimistic assumptions for circuit 300 in FIG. 3, because the clock test and data launch on LB14 are the same rising edge. However, prior art method 400 does not improve the same pessimistic assumptions for circuit 200 in FIG. 2, because the data launch and clock test edge on LB5 occur on opposite edges. As a result, the slack computation for circuits that have data launch and clock test on opposite edges is excessively pessimistic using EinsTimer.

Figure 6:
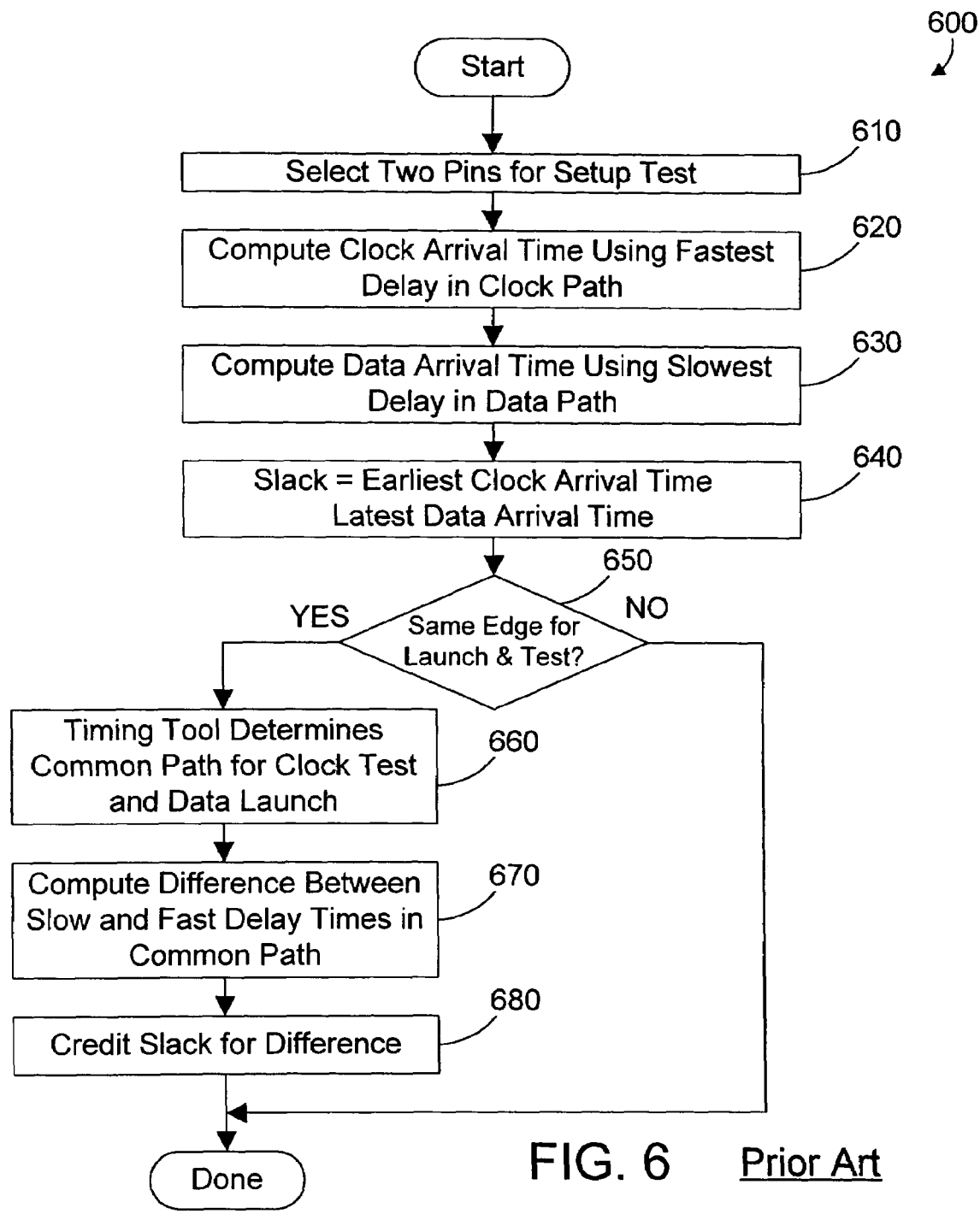
FIG. 6 is a flow diagram of a prior art method showing details of method 400 in FIG. 4.

One sample implementation of method 400 in FIG. 4 is shown as method 600 in FIG. 6. First, two input pins on a logic block are selected for a setup test (step 610). The clock arrival time using the fastest delay in the clock path is computed (step 620). The data arrival time using the slowest delay in the data path is then computed (step 630). The slack is computed as the difference between the earliest clock arrival time and the latest data arrival time (step 640). We see from FIG. 6 that steps 610, 620, 630 and 640 implement step 410 of FIG. 4. If the clock test and data launch signals occur on the same edge of the clock (step 650=YES), the timing tool then determines a common path for clock and data (step 660). The difference between the fast and slow delay times in the common path is then computed (step 670). The slack computed in step 640 is then given credit for the difference between the fast and slow delay times computed in step 670 (step 680).

Referring to FIG. 2, we assume that the data and clock pins of LB5 are selected in step 610. The earliest arrival in the clock path computed in step 620 is 2+2+2=6. The latest arrival in the data path computed in step 630 is 4+4+4+2=14.

The slack computed in step 630 is the difference between the two, 6−14=−8. The negative number on the slack indicates a timing problem, because the clock can conceivably occur under best-case timing assumptions when the data is not yet present under worst-case timing assumptions. Note, however, that assuming best-case timing for clock and worst-case timing for data in the circuit 200 in FIG. 2 is not reasonable, because both clock and data pass through common blocks LB1, LB2 and LB3. It is physically impossible for a logic block to provide best-case timing for a signal and worst-case timing for the same signal at the same time. For this reason, EinsTimer allows correcting the slack for signals that are based on the same edge.

Referring again to FIG. 6, the clock test and data launch signals on LB5 occur on opposite edges (step 650=NO). As a result, method 600 is done, and the pessimistic assumptions for slack remain unaltered. For the circuit in FIG. 3, the slack is computed in step 640 to be −8 using the same computation as for FIG. 2. The difference is that the clock test and data launch on LB14 both occur on the same edge (step 650=YES). As a result, the timing tool may determine the common path for the clock and data (step 660). In circuit 300 in FIG. 3, the common path for clock test and data launch are blocks LB10, LB11 and LB12. The difference between the slow delay time in the common path (12) and the fast delay time in the common path (6) is then computed, with a result of 6 for this specific example in FIG. 3. The slack is then credited with the difference in step 680. Corrected slack=−8+6=−2. We see from this simple example that the prior art method 600 improves the pessimistic timing assumptions for slack when both clock and data go through common blocks preceding the logic block on which the setup test is being performed, but only for blocks that have data and clock occurring on the same edge, as shown in FIG. 3. The pessimistic timing assumptions for the circuit 200 in FIG. 2 remain uncorrected in the prior art because the clock test and data launch occur on different edges.

2.0 Description of Preferred Embodiments

The preferred embodiments improve known static timing tools such as EinsTimer by providing a method for adjusting the slack values for logic blocks where clock test and data launch occur on opposite edges to improve the pessimistic assumptions made during LCD analysis. Using the method of the preferred embodiments, a large number of timing errors may be eliminated with minimal input from the user.

Figure 1:
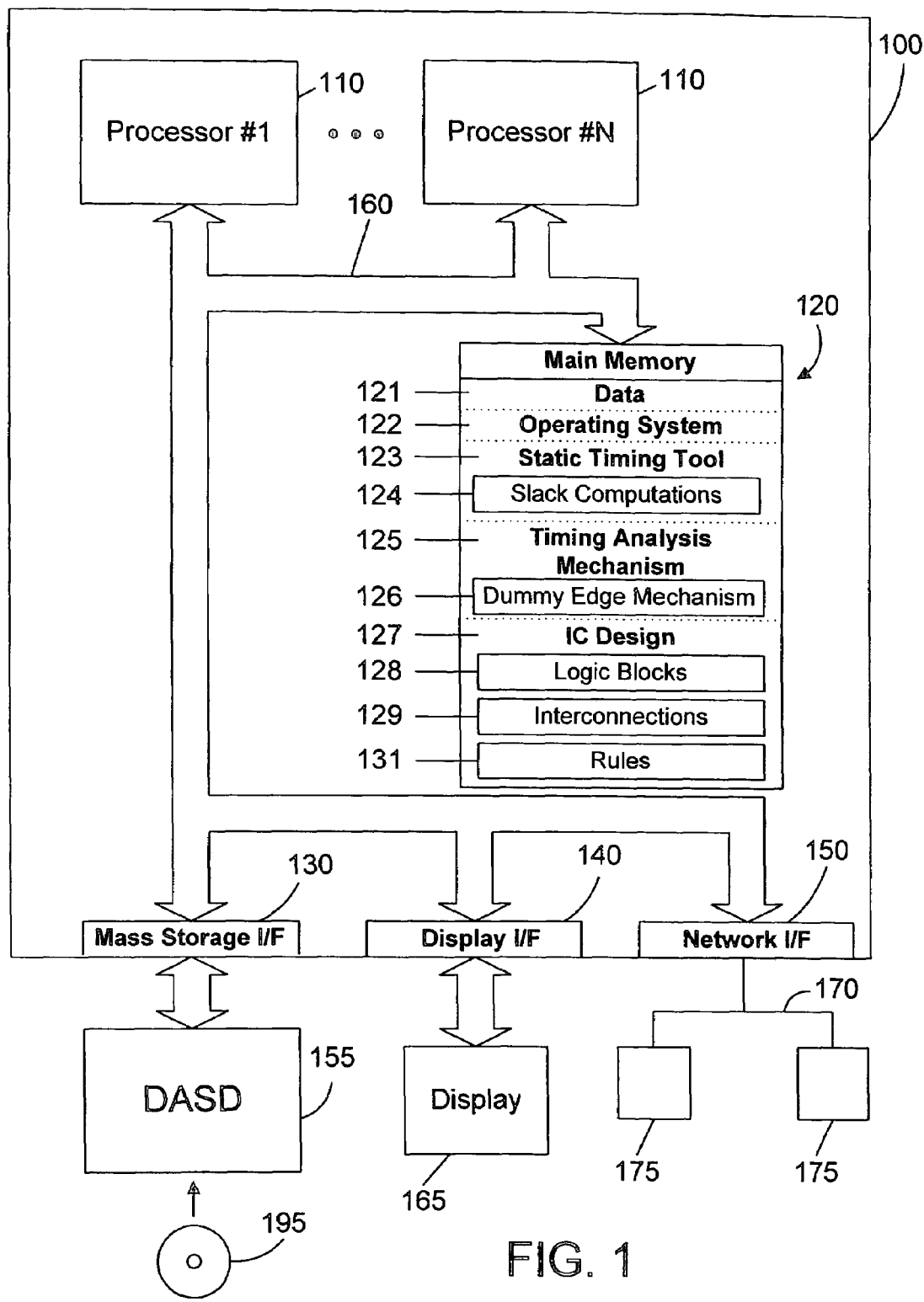
FIG. 1 is a block diagram of a computer apparatus in accordance with the preferred embodiments.

Referring to FIG. 1, a computer system 100 is an enhanced IBM eServer iSeries computer system, and represents one suitable type of computer system in accordance with the preferred embodiments. Those skilled in the art will appreciate that the mechanisms and apparatus of the present invention apply equally to any computer system. As shown in FIG. 1, computer system 100 comprises one or more processors 110 connected to a main memory 120, a mass storage interface 130, a display interface 140, and a network interface 150. These system components are interconnected through the use of a system bus 160. Mass storage interface 130 is used to connect mass storage devices (such as a direct access storage device 155) to computer system 100. One specific type of direct access storage device is a CD RW drive, which may read data from a CD RW 195.

Main memory 120 contains data 121, an operating system 122, a static timing tool 123, a timing analysis mechanism 125, and an integrated circuit design 127. Data 121 is any data that may be read or written by any processor 110 or any other device that may access the main memory 120. Operating system 122 is a multitasking operating system, such as OS/400, AIX, or Linux; however, those skilled in the art will appreciate that the spirit and scope of the present invention is not limited to any one operating system. Any suitable operating system may be used. Operating system 122 is a sophisticated program that contains low-level code to manage the resources of computer system 100. Some of these resources are processor 110, main memory 120, mass storage interface 130, display interface 140, network interface 150, and system bus 160.

Integrated circuit design 127 suitably includes logic blocks 128, interconnections 129, and rules 131. Logic blocks 128 are basic building blocks that typically include transistor structures that define circuit components, such as gates and latches. Interconnections 129 are the connections between the logic blocks 128. Rules 131 define the performance for the integrated circuit design, and are based on the selected technology for the integrated circuit. Rules 131 suitably specify the size of a logic block, and the best-case and worst-case delay characteristics of signals within the logic blocks and between logic blocks.

Static timing tool 123 performs static timing analysis on an integrated circuit design 127. Static timing tool 123 performs a plurality of slack computations 124 that define whether there is a timing problem for data setup between pins on a logic block in the integrated circuit design. Slack is a non-negative number if the data setup time is satisfied, with the value indicating how much play (or "slack") exists before the timing is violated. If slack is zero, the data setup time is satisfied, but just barely. If slack is negative, the data setup time is not satisfied, and the value indicates how bad the problem is. For example, a slack value of −4 indicates that, under worst-case timing assumptions for data setup time, the clock could occur 4 time units before the data is guaranteed to be valid. Negative slack numbers indicate timing problems that integrated circuit designers must normally investigate manually. A designer would typically select one timing problem, determine the cause of the problem, and come up with solutions to overcome the timing problem. This is very tedious and time-consuming when thousands of timing problems are identified by the static timing tool 123.

A timing analysis mechanism 125 provides input to the static timing tool 123 to improve the pessimistic assumptions made by the static timing tool 123 regarding slack computations 124. The timing analysis mechanism 125 may be implemented within the static timing tool 123, but is preferably implemented external to the static timing tool 123 so that no changes are required to the static timing tool 123. The timing analysis mechanism 125 includes a dummy edge mechanism 126 that allows specifying a dummy clock test edge that occurs on the same edge as the data launch signal. This dummy edge allows the static timing tool 123 to automatically compute the value to use to improve the slack computations even though the real clock test and data launch signals occur on opposite edges. The dummy edge mechanism 126 essentially tricks the static timing tool 123 into automatically identifying the common blocks and relevant delay values for the clock test and data launch signals on a logic block that has a clock test signal and data launch signal that occur on opposite edges. It accomplishes this trick by creating a dummy clock test edge that occurs on the same edge as the data launch signal. The native CPPR function of the static timing tool then finds the delay values to use as the basis for computing the improvement in slack due to the common blocks.

Computer system 100 utilizes well known virtual addressing mechanisms that allow the programs of computer system 100 to behave as if they only have access to a large, single storage entity instead of access to multiple, smaller storage entities such as main memory 120 and DASD device 155. Therefore, while data 121, operating system 122, static timing tool 123, timing analysis mechanism 125, and integrated circuit design 127 are shown to reside in main memory 120, those skilled in the art will recognize that these items are not necessarily all completely contained in main memory 120 at the same time. It should also be noted that the term "memory" is used herein to generically refer to the entire virtual memory of computer system 100.

Processor 110 may be constructed from one or more microprocessors and/or integrated circuits. Processor 110 executes program instructions stored in main memory 120. Main memory 120 stores programs and data that processor 110 may access. When computer system 100 starts up, processor 110 initially executes the program instructions that make up the operating system 122.

Although computer system 100 is shown to contain only a single system bus, those skilled in the art will appreciate that the present invention may be practiced using a computer system that has multiple buses. In addition, the I/O interfaces that are used in the preferred embodiment each may include separate, fully programmed microprocessors that are used to off-load compute-intensive processing from processor 110, as in iSeries input/output processors, or may be simple industry standard I/O adapters (IOAs).

Display interface 140 is used to directly connect one or more displays 165 to computer system 100. These displays 165, which may be non-intelligent (i.e., dumb) terminals or fully programmable workstations, are used to allow system administrators and users to communicate with computer system 100. Note, however, that while display interface 140 is provided to support communication with one or more displays 165, computer system 100 does not necessarily require a display 165, because all needed interaction with users and other processes may occur via network interface 150.

Network interface 150 is used to connect other computer systems and/or workstations (e.g., 175 in FIG. 1) to computer system 100 across a network 170. The present invention applies equally no matter how computer system 100 may be connected to other computer systems and/or workstations, regardless of whether the network connection 170 is made using present-day analog and/or digital techniques or via some networking mechanism of the future. In addition, many different network protocols can be used to implement a network. These protocols are specialized computer programs that allow computers to communicate across network 170. TCP/IP (Transmission Control Protocol/Internet Protocol) is an example of a suitable network protocol.

At this point, it is important to note that while the present invention has been and will continue to be described in the context of a fully functional computer system, those skilled in the art will appreciate that the present invention is capable of being distributed as a program product in a variety of forms, and that the present invention applies equally regardless of the particular type of computer readable signal bearing media used to actually carry out the distribution. Examples of suitable signal bearing media include: recordable type media such as floppy disks and CD RW (e.g., 195 of FIG. 1), and transmission type media such as digital and analog communications links.

Figure 5:
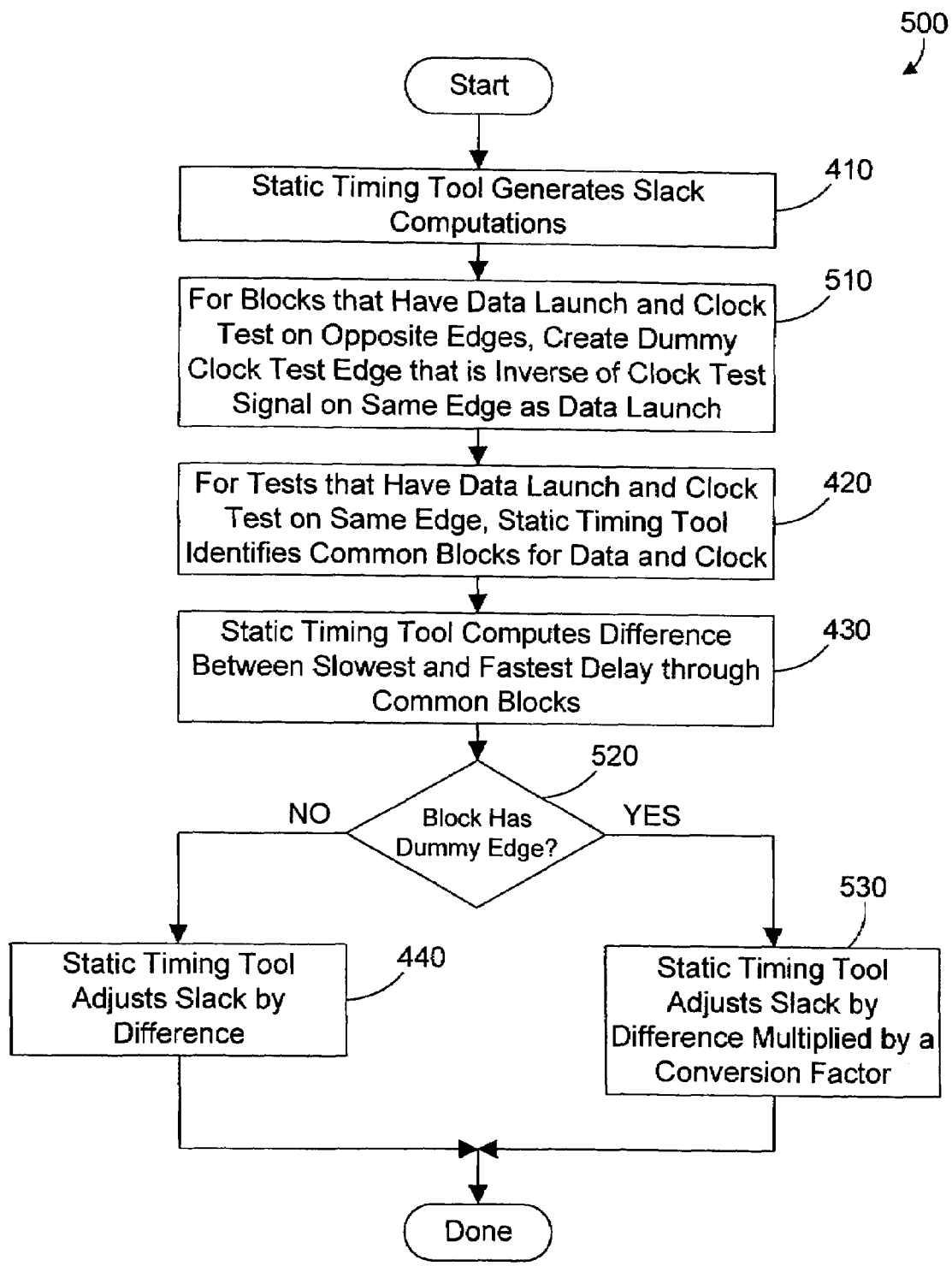
FIG. 5 is a flow diagram of a method in accordance with the preferred embodiments for adjusting slack in an integrated circuit design.

Referring to FIG. 5, a method 500 for performing static timing analysis on an integrated circuit design using dummy edge modeling includes steps 410, 420, 430 and 440 in prior art method 400 of FIG. 4. In addition, method 500 includes an additional step 510 not found in the prior art, which creates a dummy clock test edge on the same edge as the data launch signal (step 510). This dummy edge causes steps 420 and 430 to compute the effect of automatically identified common blocks. If the block does not have a dummy edge (step 520=NO), this means the clock test and data launch signals occur naturally on the same edge, so the slack is adjusted by the difference between the slowest and fastest delay through the common blocks, computed in step 430 (step 440). If the block has a dummy edge (step 520=YES), this means the dummy edge tricked the static timing tool into performing steps 420 and 430 when they would not normally have been performed. Note, however, that the difference computed in step 430 must be multiplied by a conversion factor, preferably the LCD pulse width correction factor of 0.7. The slack is then adjusted by the product of the difference computed in step 430 multiplied by the conversion factor (step 530).

Figure 7:
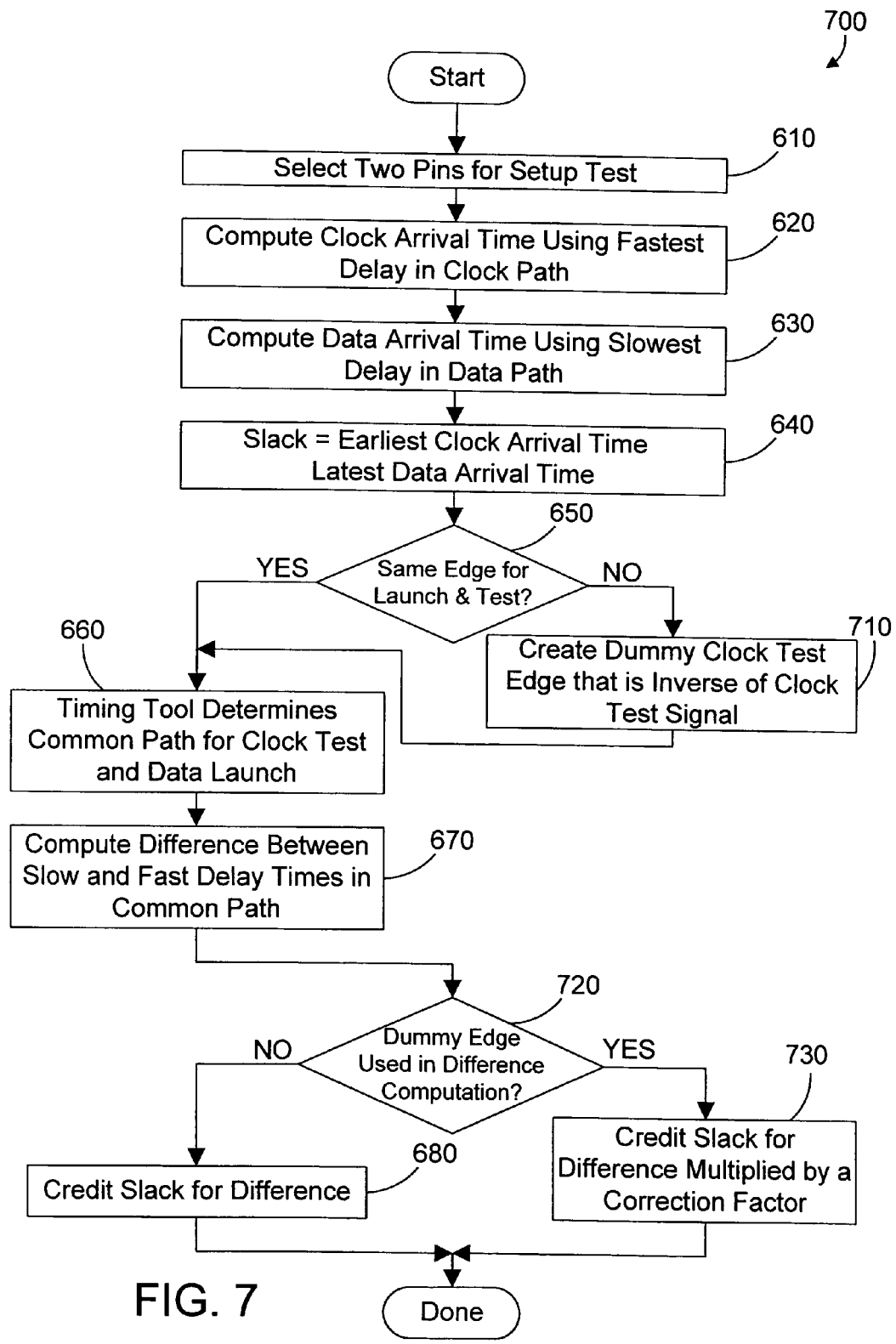
FIG. 7 is a flow diagram of a method in accordance with the preferred embodiments showing details of method 500 in FIG. 5 for a setup test.

One particular implementation of method 500 of FIG. 5 in accordance with the preferred embodiments for the case of running a setup test is shown as method 700 in FIG. 7. Steps 610, 620, 630, 640, 650, 660, 670 and 680 are the same as in prior art method 600 shown in FIG. 6. The difference lies in steps 710, 720 and 730. Step 710 is performed when the data launch and clock test signals occur on opposite edges (step 650=NO), and creates a dummy clock test edge that is the inverse of the clock test signal. Once the dummy clock test edge has been created, steps 660 and 670 are performed as usual, but using the dummy clock test edge. The dummy clock test edge tricks the static timing tool into thinking the clock test and data launch signals occur on the same edge. As a result, steps 660 and 670 are performed using the native function of the static timing tool. These steps automatically determine a common path for the clock test and data launch signals (step 660), and compute a difference between the slow and fast delay times in the common path (step 670). If the block does not have a dummy edge (step 720=NO), the slack is credited with the difference computed in step 670 (step 680). If the block has a dummy edge (step 720=YES), the difference computed in step 670 is multiplied by a conversion factor (such as the LCD conversion factor of 0.7), and the slack is adjusted by the resulting product (step 730).

We now apply method 700 of FIG. 7 to the two circuits 200 and 300 in FIGS. 2 and 3, respectively. First we consider circuit 200 of FIG. 2. The slack between the clock and data inputs of LB5 in FIG. 2 is computed to be −8 in steps 610–640 using the same numbers and formulae described above with respect to prior art method 600 in FIG. 6. The clock test and data launch occur on opposite edges (data launch on the rising edge, clock test on the falling edge) (step 650=NO). At this point, a dummy rising clock test edge is created by creating a signal that is the inverse of the clock test signal (step 710). The timing tool then automatically determines the common path for the clock test and data launch signals (step 660). For the specific circuit 200 shown in FIG. 2, the timing tool identifies the common path to include LB1, LB2 and LB3 in step 660. The difference between the slow and fast delay times in the common path is then computed (12−6=6) (step 670). Note that steps 660 and 670 use the native function provided by the timing tool. However, the timing tool is tricked into performing these steps even when the real clock test and data launch occur on opposite edges by providing a dummy clock test signal that occurs on the same edge as the data launch signal.

A dummy edge was used in the difference computation (step 720=YES), so the slack (−8) is credited with the difference computed in step 670 (6) multiplied by a conversion factor (0.7) (step 730). We use here the LCD correction factor of 0.7, which results in an adjustment of 6*0.7 or 4.2. We add this to the slack of −8, which provides an adjusted slack of −3.8 in step 730.

Next we consider circuit 300 of FIG. 3. For this circuit, steps 610, 620, 630, 640, 650, 660, 670 are performed, as described above with respect to method 600 in FIG. 6. The block has no dummy edge (step 720=NO), so the slack of −8 is adjusted by the difference of 6 computed in step 670. The result is an adjusted slack of −2 for circuit 300 in step 680 of FIG. 7.

Using prior art method 600 in FIG. 6, the slack for circuit 200 in FIG. 2 is −8, while the slack for circuit 300 in FIG. 3 is −2. Using method 700 of the preferred embodiments, the slack for circuit 200 in FIG. 2 is −3.8, while the slack for circuit 300 in FIG. 3 is −2. We see from these simple examples that the preferred embodiments improves the slack computation when data launch and clock test occur on opposite edges, as is the case in circuit 200 in FIG. 2, by creating a dummy edge that forces the timing tool to identify common blocks and compute a slack improvement even though the clock test and data launch signals occur on opposite edges.

Figure 9:
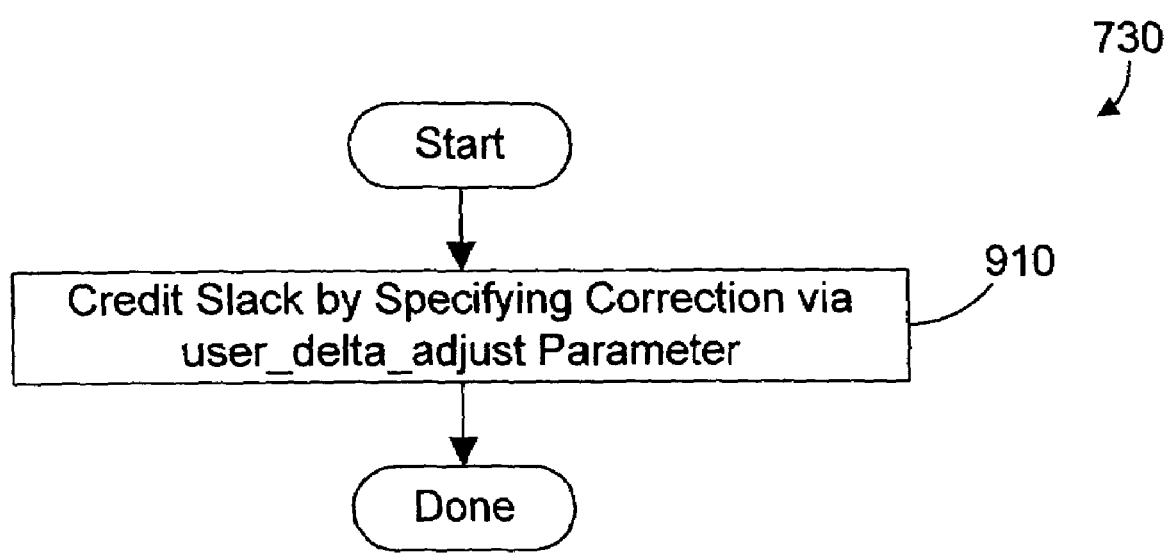
FIG. 9 is a flow diagram showing one suitable implementation of step 730 of FIGS. 7 and 8 in accordance with the preferred embodiments.

In one specific implementation in accordance with the preferred embodiments, the timing tool itself is modified to create a dummy clock test edge in step 710. However, modifying the static timing tool is not a trivial endeavor. The static timing tool is a very large and sophisticated computer program that is not easily changed. For this reason, a different implementation in accordance with the preferred embodiments uses a prior art static timing tool (such as EinsTimer) along with a script that is executed to perform the steps 710, 720 and 730 in FIG. 7. In this implementation, no changes are required to EinsTimer. All necessary extra steps are made via a script that may be executed by EinsTimer. The script preferably performs steps 710 and 720. The credit for slack adjustment in step 730 in FIG. 7 is preferably performed by specifying a user_delta_adjust parameter on the clock test signal, as shown in step 910 of FIG. 9. The user_delta_adjust parameter allows the user to specify a manual adjustment for the clock signal. Thus, the slack may be adjusted from −8 to −3.8 in step 730 by specifying a user_delta_adjust of 4.2 to the clock signal on LB5. Any other user_delta_adjust parameters that are specified for the clock signal that are input to LB5 to adjust the slack will be added to the value 4.2 to preserve them as this slack adjustment is made.

Figure 8:
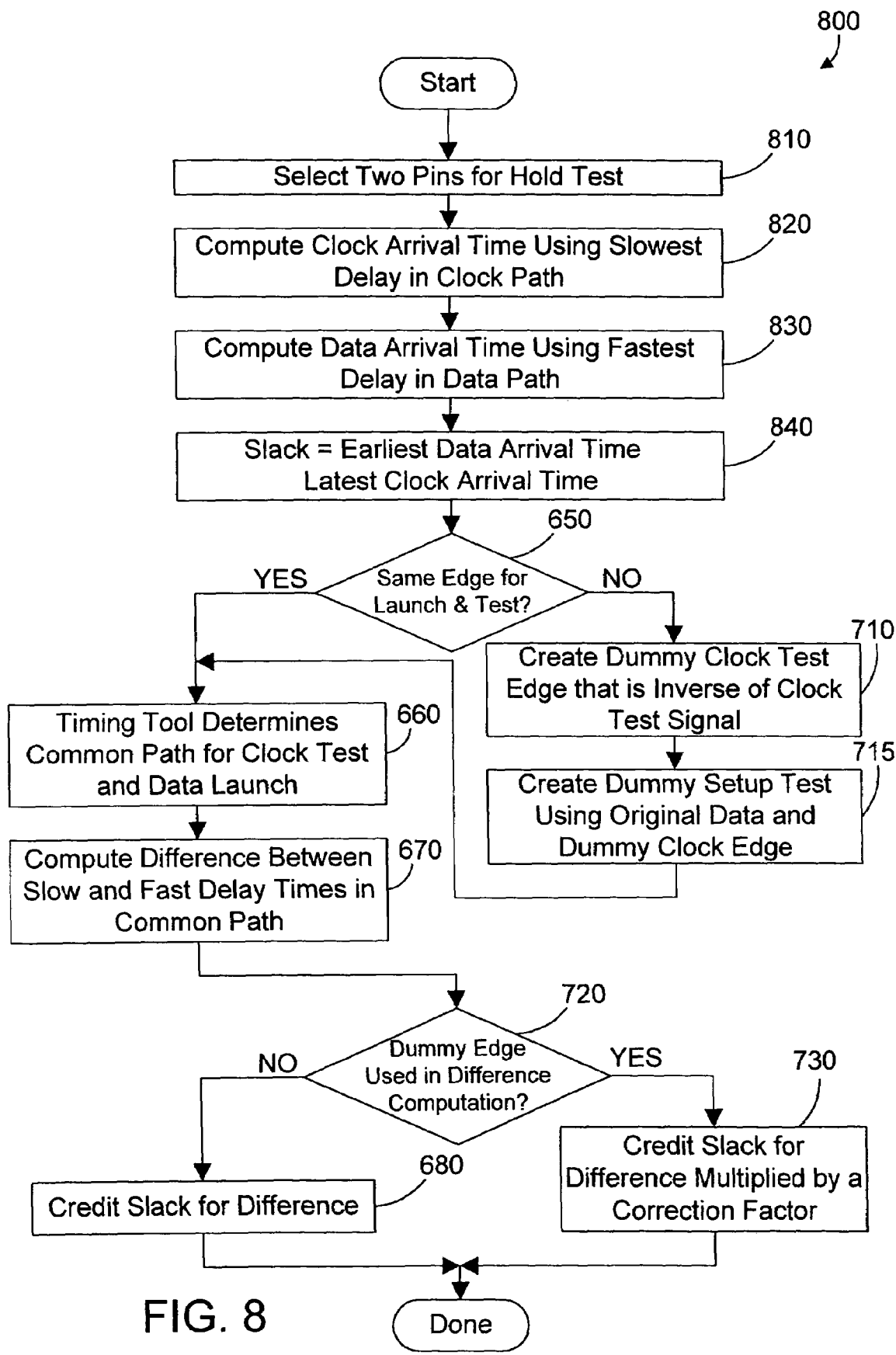
FIG. 8 is a flow diagram of a method in accordance with the preferred embodiments showing details of method 500 in FIG. 5 for a hold test.

One particular implementation of method 500 of FIG. 5 in accordance with the preferred embodiments for the case of running a hold test is shown as method 800 in FIG. 8. Steps 660, 670 and 680 are the same as in prior art method 600 shown in FIG. 6, and steps 710, 720 and 730 are the same as in method 700 shown in FIG. 7. Steps 810, 820, 830 and 840 replace steps 610, 620, 630 and 640 because the slack for a data hold test is computed differently than the slack for a data setup test. First, two pins are selected for a data hold test (step 810). The clock arrival time using the slowest delay in the clock path is computed (step 820). The data arrival time using the fastest delay in the data path is computed (step 830). Slack is then computed as the earliest data arrival time less the latest clock arrival time. Again, a negative slack number indicates a timing problem.

When the data launch and clock test signals have opposite edges (step 650=NO), a dummy clock test edge is created that is the inverse of the clock test signal (step 710), which results in the data launch and dummy clock test signals occurring on the same edge. Next, a dummy setup test is created using the original data launch signal and the dummy clock test edge (step 715). Static timing tools such as EinsTimer typically perform CPPR functions differently for a data setup test than for a data hold test. The proper logic that we want EinsTimer to perform is the logic for the setup test, even when a hold test is being performed. For this reason we have to trick EinsTimer into performing a dummy setup test created in step 715 so that it will perform steps 660 and 670. If a dummy edge was not used in the difference computation in step 670 (step 720=NO), the slack is credited with the difference (step 680). If a dummy edge was used in the difference computation in step 670 (step 720=YES), the slack is credited with the difference multiplied by a correction factor (step 730).

As stated above, step 730 may be performed by specifying a user delta adjust for the clock test signal. In the hold test case, the difference computed in step 670 is multiplied by the conversion factor, then subtracted from the clock test edge by specifying a negative user delta adjust for the clock test edge.

The preferred embodiments allow improving slack computations in a linear combinations of delay (LCD) analysis in a static timing tool for logic blocks that have data launch and clock test that occur on opposite edges. This allows the static timing tool to automatically compensate for many pessimistic timing results that would otherwise be generated by the static timing tool.

One skilled in the art will appreciate that many variations are possible within the scope of the present invention. Thus, while the invention has been particularly shown and described with reference to preferred embodiments thereof, it will be understood by those skilled in the art that these and other changes in form and details may be made therein without departing from the spirit and scope of the invention.

What is claimed is:

1. An apparatus comprising:
   at least one processor;
   a memory coupled to the at least one processor;
   an integrated circuit design residing in the memory, the integrated circuit design including a plurality of logic blocks;
   a static timing tool residing in the memory and executed by the at least one processor, the static timing tool performing analysis that results in a plurality of slack computations;
   a timing analysis mechanism residing in the memory and executed by the at least one processor, the timing analysis mechanism including a dummy edge mechanism that creates a dummy clock test edge for a selected logic block that has a clock test signal and a data launch signal that are on opposite edges in a manner that results in the dummy clock test edge and the data launch signal being on the same edge, the static timing tool automatically identifying in the integrated circuit design at least one common logic block through which the clock test signal and the data launch signal both pass before arriving at the selected logic block, the timing analysis mechanism automatically improving at least one of the plurality of slack computations due to the at least one common logic block.

2. The apparatus of claim 1 wherein the static timing tool is EinsTimer.

3. The apparatus of claim 1 wherein the timing analysis mechanism determines a difference between fastest and slowest delay through the at least one common logic block, multiplies the difference by a correction factor, and adjusts the slack by the difference multiplied by the correction factor.

4. The apparatus of claim 1 wherein the timing analysis mechanism improves at least one of the plurality of slack computations using at least one user delta adjust parameter to adjust the clock test signal.

5. The apparatus of claim 1 wherein the timing analysis mechanism improves input to the static timing tool but is not part of the static timing tool.

6. An apparatus comprising:
   at least one processor;
   a memory coupled to the at least one processor;
   an integrated circuit design residing in the memory, the integrated circuit design including a plurality of logic blocks;
   a static timing tool residing in the memory and executed by the at least one processor, the static timing tool performing analysis that results in a plurality of slack computations; and
   a timing analysis mechanism residing in the memory and executed by the at least one processor, the timing analysis mechanism being separate from the static timing tool and providing input to the static timing tool, wherein the timing analysis mechanism creates a dummy clock test edge for a selected logic block that has a clock test signal and a data launch signal that are on opposite edges in a manner that results in the dummy clock test edge and the data launch signal being on the same edge, the static timing tool automatically identifying in the integrated circuit design at least one common logic block through which the clock test signal and the data launch signal both pass before arriving at the selected logic block, the timing analysis mechanism automatically improving at least one of the plurality of slack computations due to the at least one common logic block using at least one user delta adjust parameter to adjust the clock test signal.

7. The apparatus of claim 6 wherein the static timing tool is EinsTimer.

8. The apparatus of claim 6 wherein the timing analysis mechanism determines a difference between fastest and slowest delay through the at least one common logic block, multiplies the difference by a correction factor, and adjusts the slack by the difference multiplied by the correction factor.

9. A computer readable program product comprising:
   a timing analysis mechanism that includes a dummy edge mechanism that creates a dummy clock test edge for a selected logic block in an integrated circuit design, the selected logic block having a clock test signal and a data launch signal that are on opposite edges, the dummy edge mechanism creating the dummy clock test edge so the dummy clock test edge and the data launch signal are on the same edge, the timing analysis mechanism automatically identifying in the integrated circuit design at least one common logic block through which the clock test signal and the data launch signal both pass before arriving at the selected logic block, the timing analysis mechanism automatically improving at least one of a plurality of slack computations due to the at least one common logic block; and
   recordable media bearing the timing analysis mechanism.

10. The program product of claim 9 wherein the timing analysis mechanism determines a difference between fastest and slowest delay through the at least one common logic block, multiplies the difference by a correction factor, and adjusts the at least one slack computation by the difference multiplied by the correction factor.

11. The program product of claim 9 wherein the timing analysis mechanism improves at least one of the plurality of slack computations using at least one user delta adjust parameter to adjust the clock test signal.

12. A computer readable program product comprising:

a timing analysis mechanism that is separate from a static timing tool and that provides input to the static timing tool, the timing analysis mechanism creating a dummy clock test edge for a selected logic block that has a clock test signal and a data launch signal that are on opposite edges in a manner that results in the dummy clock test edge and a data launch signal on a logic block in an integrated circuit design occurring on the same edge, the timing analysis mechanism automatically identifying in the integrated circuit design at least one common logic block through which the clock test signal and the data launch signal both pass before arriving at the selected logic block, the timing analysis mechanism automatically improving at least one of a plurality of slack computations due to the at least one common logic block using at least one user delta adjust parameter to adjust the clock test signal; and recordable media bearing the timing analysis mechanism.

13. The program product of claim 12 wherein the static timing tool is EinsTimer.

14. The program product of claim 12 wherein the timing analysis mechanism determines a difference between fastest and slowest delay through the at least one common logic block, multiplies the difference by a correction factor, and adjusts the at least one slack computation by the difference multiplied by the correction factor.

* * * * *